United States Patent
Dermark (10) Patent No.: US 9,743,520 B2
(45) Date of Patent: Aug. 22, 2017

(54) POWER MODULE

(71) Applicant: Telefonaktiebolaget L M Ericsson (publ), Stockholm (SE)

(72) Inventor: Martin Dermark, Landvetter (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 24 days.

(21) Appl. No.: 14/650,940

(22) PCT Filed: Dec. 11, 2012

(86) PCT No.: PCT/EP2012/075037
§ 371 (c)(1),
(2) Date: Jun. 10, 2015

(87) PCT Pub. No.: WO2014/090284
PCT Pub. Date: Jun. 19, 2014

(65) Prior Publication Data
US 2015/0313019 A1    Oct. 29, 2015

(51) Int. Cl.
*H05K 1/18* (2006.01)
*H05K 1/00* (2006.01)
(Continued)

(52) U.S. Cl.
CPC ............... *H05K 1/18* (2013.01); *H02M 1/00* (2013.01); *H05K 1/141* (2013.01);
(Continued)

(58) Field of Classification Search
CPC .......... H02M 1/00; H05K 1/141; H05K 1/18; H05K 2201/10166; H05K 2201/1034; H05K 2201/10757
(Continued)

(56) References Cited

U.S. PATENT DOCUMENTS

| 9,040,181 | B2 | 5/2015 | McGuire |
| 2002/0057158 | A1* | 5/2002 | Matsumoto ........... H01F 27/027 336/83 |

(Continued)

FOREIGN PATENT DOCUMENTS

| JP | 02-134890 A | 5/1990 |
| JP | H06276737 A | 9/1994 |

(Continued)

OTHER PUBLICATIONS

Notification of Reasons of Refusal issued by the Japaneese Patent Office in Corresponding Application No. 2015-546863, dated Jul. 1, 2016, 5 pages (3 page translation).
(Continued)

*Primary Examiner* — Eric Thomas
*Assistant Examiner* — Michael P McFadden
(74) *Attorney, Agent, or Firm* — Rothwell, Figg, Ernst and Manbeck, P.C.

(57) ABSTRACT

A power module (100) arranged to receive an input voltage and to deliver an output voltage, comprising a supporting layer (110) with first and second main surfaces (111, 109) and a rim (122) surrounding the main surfaces. The power module (100) also comprises at least one component (112, 113, 114, 115) on or in the supporting layer (110) which protrudes a first perpendicular distance ($d_1$) from one of the main surfaces. The power module (100) additionally comprises connectors (116-119; 120-123) for attaching the power module (100) to an external component (10). The one or more connectors (116-119; 120-123) protrude a second distance ($d_2$) from said rim (122) in a perpendicular direction from one of the main surfaces (111, 109), so that the least one component is at a predefined distance ($d_4$, $d_5$) from the external component (10) when the power module is attached to the external component (10).

8 Claims, 5 Drawing Sheets (51) Int. Cl.
*H05K 1/14* (2006.01)
*H02M 1/00* (2006.01)

(52) U.S. Cl.
CPC ............... *H05K 2201/1034* (2013.01); *H05K 2201/10166* (2013.01); *H05K 2201/10757* (2013.01)

(58) Field of Classification Search
USPC ........................................................ 361/782
See application file for complete search history.

(56) References Cited

U.S. PATENT DOCUMENTS

| | | | |
|---|---|---|---|
| 2002/0075658 A1 | 6/2002 | Sano et al. | |
| 2002/0153872 A1* | 10/2002 | Nagai | H01F 27/2804 323/355 |
| 2008/0283982 A1 | 11/2008 | Liu et al. | |
| 2013/0194765 A1* | 8/2013 | Cho | H05K 1/183 361/764 |

FOREIGN PATENT DOCUMENTS

| | | |
|---|---|---|
| JP | 07-161899 A | 6/1995 |
| JP | 10-512717 A | 12/1998 |
| JP | 2001359281 A | 12/2001 |
| JP | 2002-134875 A | 5/2002 |
| RU | 2012134461 A | 2/2014 |
| WO | 9622671 A1 | 7/1996 |

OTHER PUBLICATIONS

International Search Report issued in corresponding application No. PCT/EP2012/075037, date Jul. 29, 2013, 3 pages.

Official Action dated Oct. 26, 2016, issued in Russian patent application No. 2015127831/07 (043184) with English translation, 13 pages.

Office Action issued by the Japanese Patent Office in related Application No. 2015-546863 dated Apr. 4, 2017, 4 pages (6 with Summary Translation).

* cited by examiner

POWER MODULE

CROSS REFERENCE TO RELATED APPLICATION(S)

This application is a 35 U.S.C. §371 National Phase Entry Application from PCT/EP2012/075037, filed Dec. 11, 2012, the disclosure of which is incorporated by reference.

TECHNICAL FIELD

The present invention discloses a power module.

BACKGROUND

Power modules are used in a vast array of electronics applications, and are used in order to supply users external or internal to the power module with a regulated power (voltage/current) feed. The regulated power feed is created by the power module using an input power feed to the power module, which the power module is arranged to convert to one or more regulated output power feeds, which is then supplied to said users.

The regulated power feed is usually a DC feed, as is also usually the case with the input power feed to the power module, in which case the power module is a DC/DC power module. However, a power module can also be an AC/AC power module, or DC/AC, as well as AC/DC.

A power module usually comprises a supporting substrate, e.g. a PCB of some kind, with one or more components arranged on the supporting substrate. As mentioned, power modules are used in a large amount of applications and occupy a certain volume, which thus adds to the height and/or width of the total design. Since this is not desirable, power components as such are instead often integrated in the design as such, i.e. on PCBs which are also used for other purposes. Such solutions are then "tailor-made" for each specific design or application, which naturally is not efficient with regards to such resources as design and verification.

SUMMARY

It is an object of the invention to obviate at least some of the disadvantages mentioned above and to provide an improved power module.

This object is obtained by means of a power module which is arranged to receive an input voltage and to deliver one or more regulated output voltages. The power module comprises a supporting layer with first and second opposing main surfaces and also comprises a rim which surrounds the main surfaces.

The power module also comprises at least one component arranged on or in the supporting layer. The at least one component protrudes a first distance in a perpendicular direction from one of the main surfaces, and the power module additionally comprises one or more connectors which are arranged for attaching the power module to a component external to the power module. The one or more connectors are arranged to protrude a second distance from the rim in a perpendicular direction from one of the main surfaces, so that the at least one component will be arranged at a predefined distance from the component which is external to the power module when the power module is attached to the component which is external to the power module.

As will become more evident from the detailed description given in this text, by means of the one or more connectors the power module can be arranged in spaces in which it has not been possible to use power modules with similar components due to reasons of size. This is due to the fact that a number of standard sizes for connectors can be used with one and the same type of power module, depending on the amount of space available to the power module in either perpendicular direction from the supporting layer of the power module.

In embodiments of the power module, one or more of the connectors are electrically conducting and comprise a first part which is connected to an electrically conducting surface of the power module, a second intermediate part attached to the first part, and a third part attached to the second part, where the third part comprises an attachment surface for attachment to the component external to the power module.

In embodiments of the power module, the at least one component also protrudes a third distance from one of the main surfaces, where the third distance is the opposite direction of the first direction.

In embodiments of the power module, the one or more connectors are attached to a bearer which is attached to the power module. In some such embodiments of the power module, the bearer comprises one or more first guidance means for guiding the bearer into a predefined position on the power module, and the power module comprises corresponding second guidance means for receiving the first guidance means.

BRIEF DESCRIPTION OF THE DRAWINGS

The invention will be described in more detail in the following, with reference to the appended drawings, in which.

DETAILED DESCRIPTION

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

Figure 1:
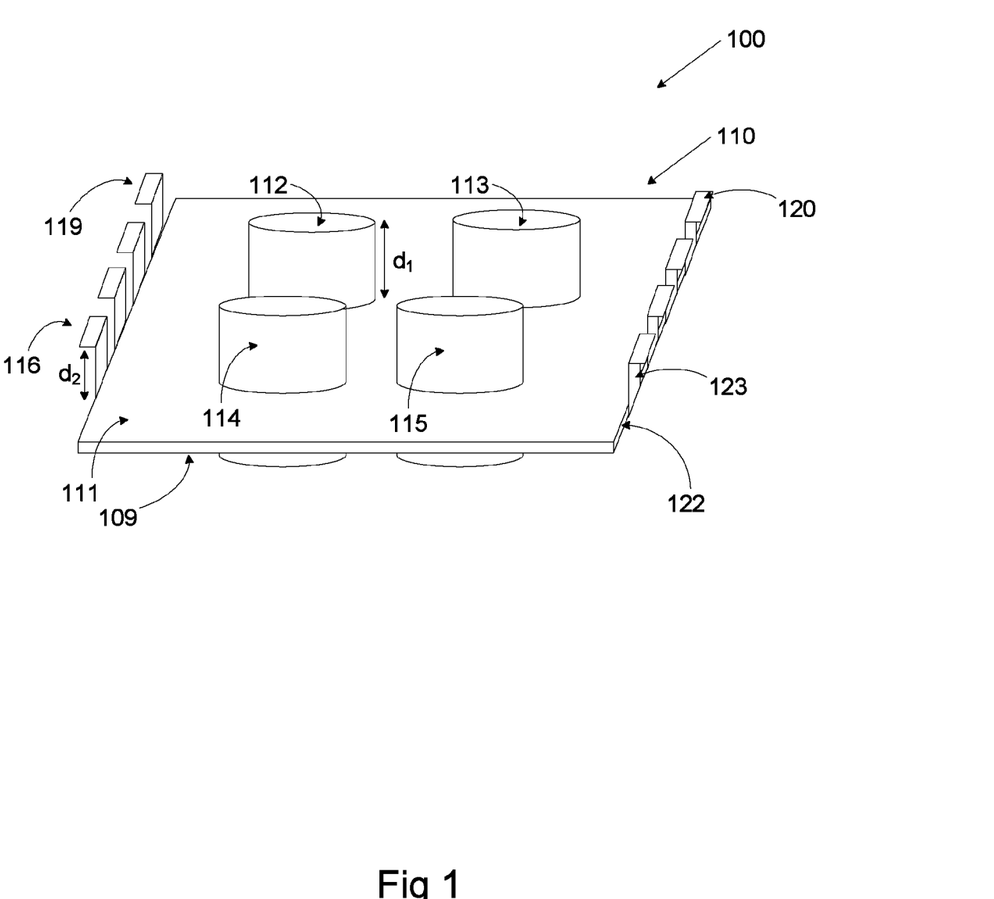
FIG. 1 shows a first embodiment of a power module.

FIG. 1 shows an embodiment of a power module 100. The power module 100 comprises a number of components 112, 113, 114, 115, e.g. capacitors and/or inductors. The components 112, 113, 114, 115 are suitably so called power components, i.e. components which are designed to withstand higher power levels than other components of the same kind.

The power module 100 is arranged to receive an input voltage at a (not shown) input port, and to use the components 112-115 in order to convert the input voltage to one or more regulated output voltages at (not shown) output ports. The input and output voltages can be either AC or DC, so that the power module can be one or more of the following kinds of power module: AC/AC, AC/DC, DC/DC, DC/AC.

As shown in FIG. 1, the power module 100 also comprises a supporting layer 110, e.g. a PCB, which has two opposing main surfaces, 111, 109. In the example shown in FIG. 1, all of the components 112-116 are arranged in the PCB 110, i.e. so that they protrude from both of the main surfaces 111, 109, of the PCB 110. In FIG. 1, the length of the components' protrusion from the main surface 111 is shown as $d_1$. Naturally, the components can protrude varyingly much, although all of the components shown in FIG. 1 are shown as protruding equally much.

Naturally, the number of components on a power module can be greater or smaller than four, and one or more of the components can be arranged on the PCB 110, i.e. so that the component in question only protrudes from one of the main surfaces 109, 111, of the PCB 110. In addition, although the components are shown as protruding in directions which are perpendicular to the main surfaces, it is of course also possible to envisage components which are arranged at a slanted angle with respect to one of the main surfaces; however, even for such a component, a perpendicular distance of protrusion can of course be found. In FIG. 1, one direction of protrusion is shown, with an extension shown as $d_1$.

The main surfaces 109, 111 are surrounded by a rim 122, which extends around the main surfaces 109, 111. As shown in FIG. 1, the rim 122 comprises four side edges, which is of course only an example, since other shapes of the power module 100 are also entirely possible, i.e. triangular, oval, round etc.

The power module 100 also comprises a number of electrical connection surfaces, which for example can be used as input and output ports for the input voltage and the regulated output voltage or voltages. Suitably, the connection surfaces are soldering surfaces. In the embodiment 100 shown in FIG. 1, the electrical connection surfaces are arranged on the main surface 109, i.e. the main surface which "faces away" from a viewer, so that the electrical connection surfaces are not shown in FIG. 1. Naturally, such electrical connection surfaces can also be arranged on both of the major surfaces 109, 111, or on the major surface 111.

FIG. 1 also shows a number of connectors 116-119 and 120-123, with an equal amount of connectors arranged at the rim 122 on opposing side edges of the PCB 100. Naturally, both the amounts of connectors and their exact locations around the rim of the PCB can be varied, so that the amounts and locations of the connectors shown in FIG. 1 should be seen as an example only.

As shown in FIG. 1, the connectors 116-119 and 120-123 are arranged to protrude a perpendicular distance $d_2$ from one of the main surfaces, in this case the main surface 109, i.e. the main surface which is not shown in FIG. 1 since it is "the bottom side" in the view of FIG. 1. The distance that the connectors protrude can be measured from either of the main surfaces 111, 109, as long as the purpose of these connectors, which will be explained below, is obtained.

In order to enhance the understanding of the function of the connectors 116-119; 120-123, a connector will now be described in more detail, with reference to FIG. 2 which shows the connector 116 from FIG. 1. It should be pointed out that the connectors can be either electrically non-conducting, in which case they serve a merely mechanical purpose, or they can be made electrically conducting, in which case they serve dual purposes, both mechanical and electrical. Both of these cases will be described below.

Figure 2:
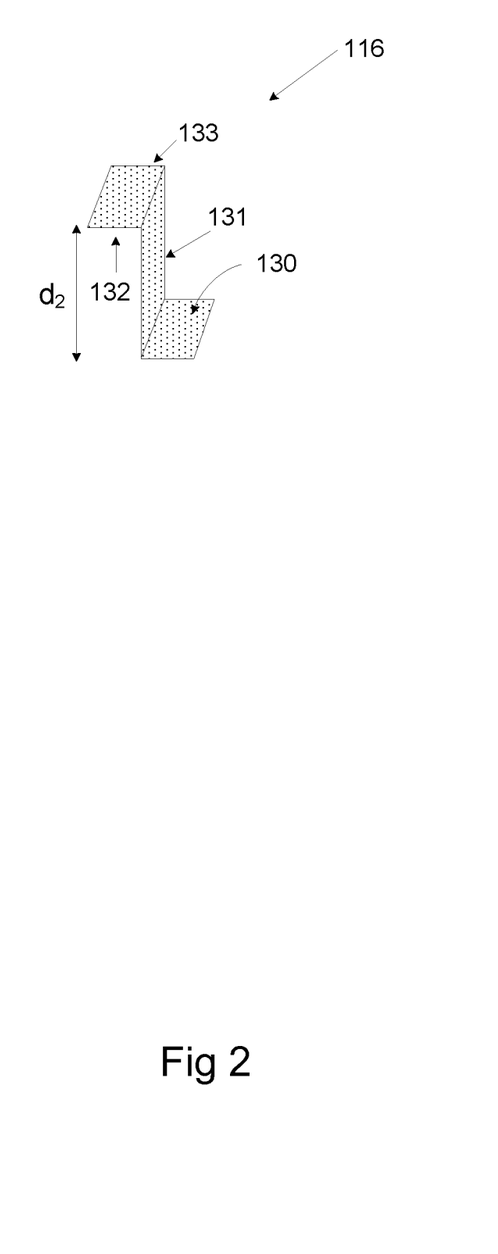
FIGS. 2, 3a and 3b show a component from the embodiment of FIG. 1, and FIGS. 4a and 4b show the power module of FIG. 1 being attached to a component external to the power module.

As shown in FIG. 2, the connector 116 comprises a first part 130 for attachment to the power module 100, and a second intermediate part 131 which is attached to the first part 130. In addition, the connector 116 comprises a third part 132 which is attached to the second part 131. As shown in FIG. 2, the third part comprises an attachment surface 133 for attachment to a component external to the power module 100, in a manner which will be explained later in this text. Suitably, the attachment surface 133 is a solder surface. If it is desired to make the connector electrically conducting, all of its three parts should be made of or comprise an electrically conducting material. In addition, the first part 130 should be arranged so that it coincides with one of the previously mentioned electrical connection surfaces on the power module 100. In such an embodiment, the connector becomes an "extension" of the electrical connection surface, so that the electrical connection surface can be accessed by means of the third part 132.

In the embodiment shown in FIGS. 1 and 2, the second part 131 has a straight elongated shape, although other shapes are also possible. Also, as we see in FIG. 2, the third part 132 is arranged at a perpendicular angle with respect to the second part 131, for reasons which will become apparent later in this text. In various embodiments, the angle is suitably in the interval of 45°-135° with respect to the second part.

Figure 3A:
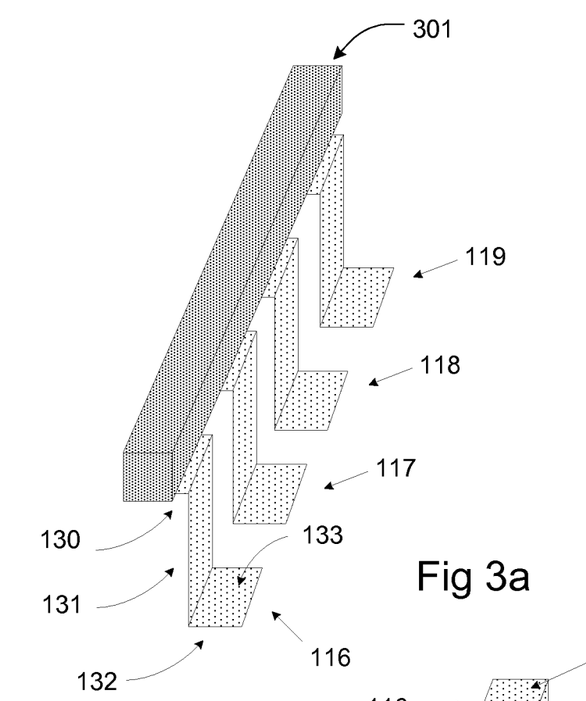

In embodiments, for example to facilitate the use of so called "pick and place" machines in production lines, one or more connectors can be attached to a common bearer, so that it is by means of attaching such a bearer to the power module that the one or more connectors are attached to the power module. An example of such a bearer 301 is shown in FIG. 3a, where the bearer 301 is shown as a straight piece of e.g. hardened rubber or some other suitable material. In the example shown in FIG. 3a, four connectors 116-119 are attached to the bearer 301. Naturally, fewer or more than four connectors can be connected to one and the same bearer, and the bearer can of course be given other shapes than the straight shape shown in FIG. 3a. Such shapes may conform to the shape of the rim 122, and may thus be curved or bent in other ways, e.g. comprising a 90° degree angle, so that the bearer is attached at a corner of a PCB such as the one 110 shown in FIG. 1.

Figure 3B:
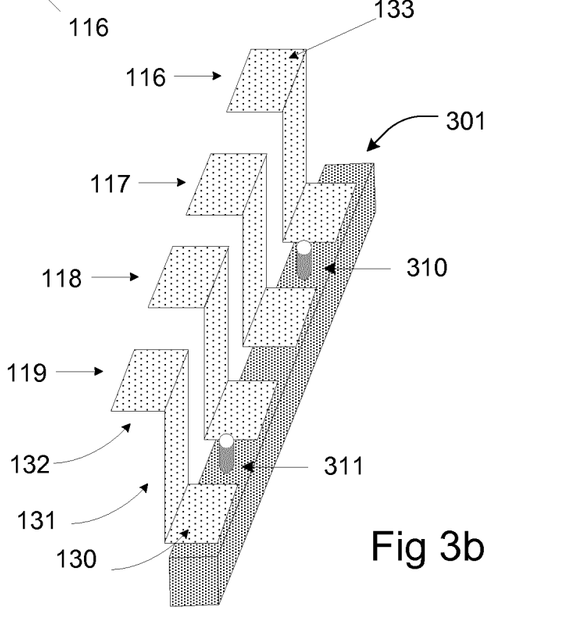

FIG. 3b shows the bearer 301 from another angle, in which it is possible to see two guiding pins 310, 311, which may be comprised in the bearer in order to guide the bearer 301 and thereby the connectors into a desired position on the PCB 110, by means of corresponding guidance means in the PCB, e.g. holes which are arranged to receive the guiding pins 310, 311.

Figure 4A:
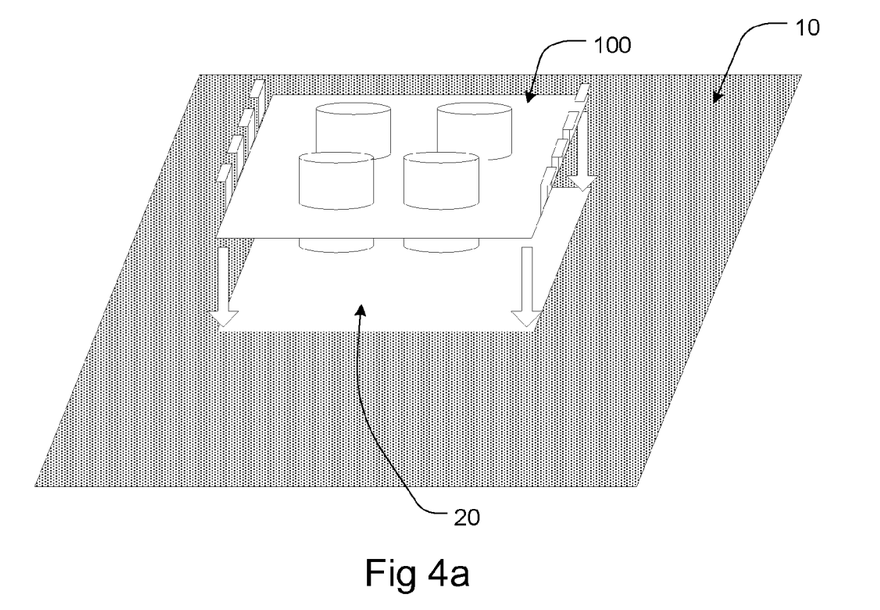
Figure 4B:
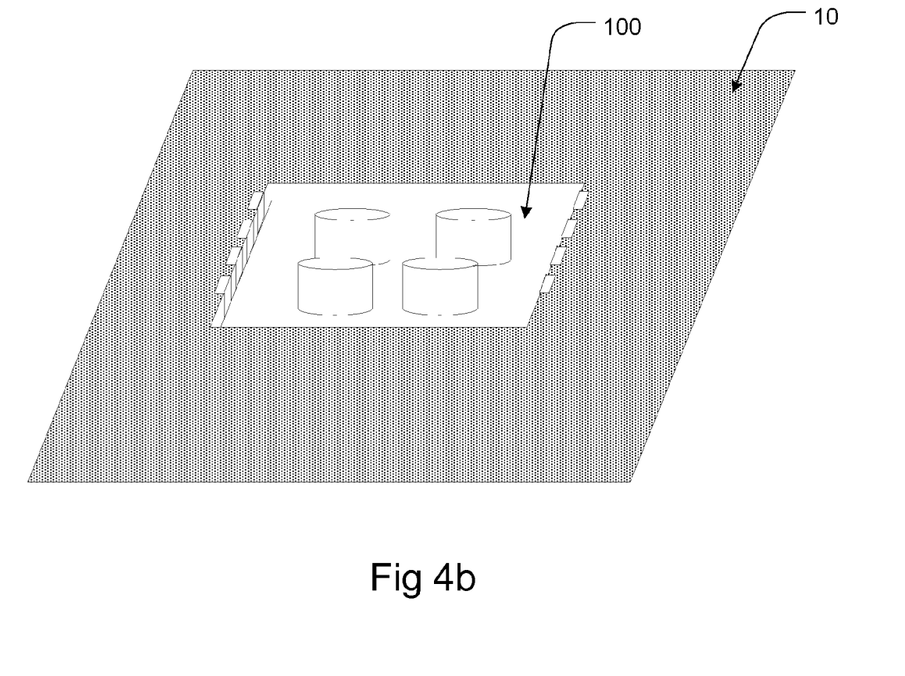

Turning now to how the power module 100 may be arranged in a component which is external to the power module 100 by means of the connectors, we turn to FIGS. 4a and 4b: In FIG. 4a, there is shown a component 10 external to the power module 100, i.e. not comprised in the power module 100. As an example, the component 10 may be seen as a larger PCB, on which there are components that the power module 100 is to supply with one or more regulated voltages. As shown in FIG. 4a, the external component 10 also has two main surfaces, i.e. in this case it has a basically flat shape.

In the component 10, there is arranged a cavity 20, with dimensions which correspond to those of the power module 100, so that the power module may be received in the cavity 20. The power module is 100 in FIG. 4a shown as being lowered into the cavity 20, as indicated by means of arrows. The supporting layer 110 may in embodiments be given a specially designed shape, e.g. a corner with a shape which deviates from the shape of the other corners of the supporting layer 110, in which case one corner of the cavity 20 of the external component 10 is given a corresponding shape, thus creating a "mechanical keying" to avoid incorrect mounting of power module 100 during production.

The power module attaches to the component 10 by means of the connectors, in more detail by virtue of the third part 132 of the connectors. In the embodiment of connectors shown in FIG. 4a, the third part 132 is arranged at an angle of 90° with respect to the second part of the connector, which enables the third part 132 to "latch on" to the surface of the component 10 outside of the cavity 20. Once the power module 100 has assumed this position, i.e. with the connectors latched on to the component 10, the third part of the connectors may be attached with additional strength to the component 10, if the third part of the connectors comprises a soldering surface 133, so that the connectors may be used to solder the power module 100 in place. Naturally, the third part of the connectors may also be a straight part, i.e. arranged at an angle of 0° with respect to the second part, and still have a soldering surface, in which case the power module 100 may also be soldered in place, but will then need to be held in place while the soldering is performed. FIG. 4b shows the power module 100 in place in the component 10 which is external to the power module 100, but in which the power module 100 is arranged. Looking at FIG. 4b, it can be understood why the connectors are in some embodiments made electrically conducting: if the connectors are electrically conducting and are attached to the previously mentioned electrical connection surfaces on the power module, the power module can be electrically accessed by means of the third part of the connectors, which in FIG. 4b can be seen protruding "over the edge" of the cavity 20 in the component 10. Naturally, the power module 100 may also be accessed at the electrical connection surfaces on the power module, if the connectors are made electrically non-conducting, or if this is deemed to be more convenient even if the connectors are electrically conducting.

Figure 5:
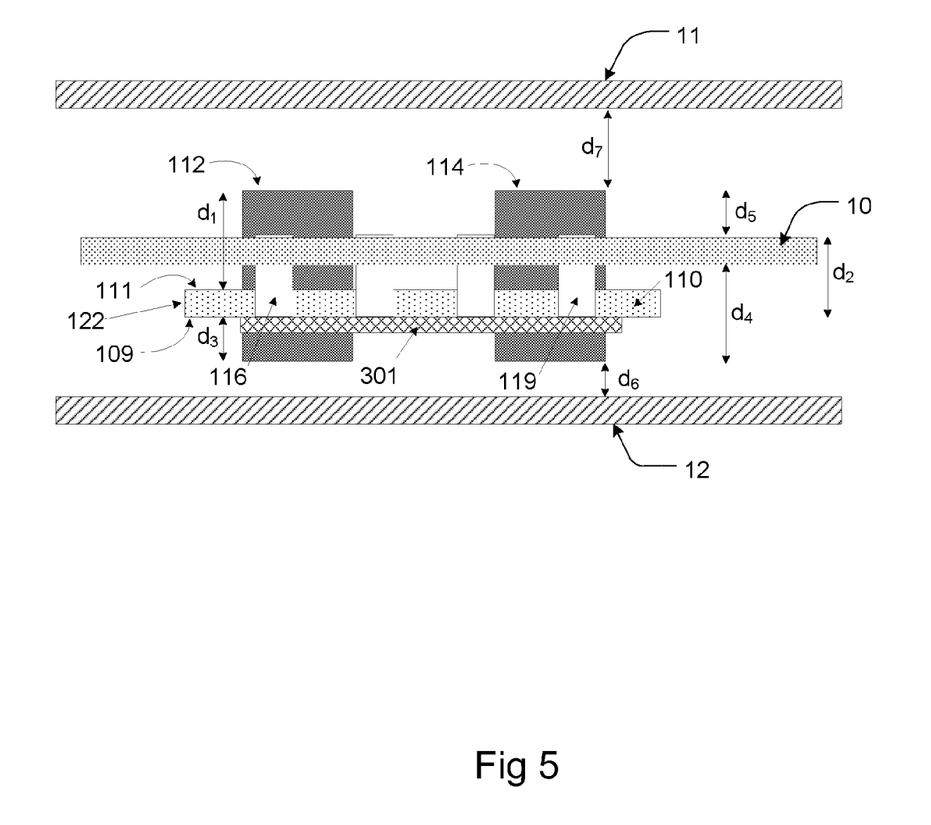
FIG. 5 shows a side view of a power module attached to a component external to the power module.

Advantages gained by means of the power module 100 will be explained in connection with FIG. 5, which shows a side view of the power module 100 arranged in a component 10 external to the power module, as in FIG. 4b. Components which have been described previously will not be explained in depth here, or may in fact not be mentioned at all in the description of FIG. 5. In FIG. 5, we see both of the main surfaces 111 and 109 of the PCB 110, and we also see the distance $d_1$ which the components 112, 114 protrude from the main surface 111, in addition to which we see a distance $d_3$ which the components 112, 114 protrude from the main surface 109. The protrusion $d_3$ is due to the fact that the components 112, 114 are arranged "in" the PCB 110, as opposed to being arranged "on" one of the main surfaces 109, 111, which could also have been the case.

Also shown in FIG. 5 are the connectors 116-119 (of which only 116 and 119 are numbered in FIG. 5, for reasons of clarity) and the distance $d_2$ that these connectors protrude from one of the main surfaces, in this case the main surface 109. We see that due to the "length" $d_2$ of the connectors 116-119, the components 112, 114 protrude distances $d_4$ and $d_5$ from the main surfaces of the external component 10. These distances $d_4$ and $d_5$ can be contrasted to the distance which the components 112, 114 would have protruded from one of the main surfaces of the external component 10 if the power module 100 had been arranged in the external component 10 without the aid of the connectors 116-119, i.e. if the power module 100 had been arranged with its PCB 110 "flush with" the component 10, in which case the components 112, 114 would essentially have protruded the distance $d_1$ in one direction and the distance $d_3$ in the other direction.

Thus, by means of the connectors, we "transform" the protrusions $d_1$ and $d_3$ into the protrusions $d_5$ and $d_4$, respectively An advantage of this becomes apparent if one considers the surfaces shown as 11 and 12 in FIG. 5: it now becomes possible to arrange the component 10 with the power module 100 in it in a space which only needs to have the dimension $d_5$ and $d_4$ on either side of the component 10.

Thus, the arrangement of the power module as shown and describe above makes it possible to install power modules in a more confined space than previously, which is of course advantageous. In addition, a series of connectors with different "height" $d_2$ can be prepared, and depending on the restrictions of height in either direction of the power module, connectors with a suitable "height" $d_2$ can be used together with standardized power modules, in order to make it possible for a standardized power module to be used in many different applications.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. An apparatus comprising:
   a circuit board having a first main surface and an opposing second main surface; and
   a power module arranged to receive an input voltage and to deliver one or more regulated output voltages, the power module comprising:
   a supporting layer with a first main surface and an opposing second main surface, the supporting layer also having and a rim surrounding said first and second main surfaces, said supporting layer having a thickness of T;
   a first component arranged on or in said supporting layer, said first component protruding a first distance in a perpendicular direction from said first main surface;
   a first connector arranged for attaching the power module to the circuit board, said first connector having a first part attached to the second main surface of the supporting layer, a second part, and a third part attached to the first main surface of the circuit board; and
   a second connector arranged for attaching the power module to the circuit board, said second connector having a first part attached to the second main surface of the supporting layer, a second part, and a third part attached to the first main surface of the circuit board, wherein
   the first part of the first connector has a planar portion that lies in a first plane;
   the third part of the first connector has a planar portion that lies in a second plane;
   the second part of the first connector is arranged to separate the planar portion of the first part of the first connector from the planar portion of the third part of the first connector such that the distance between the planar portion of the first part of the first connector and the planar portion of the third part of the first connector is a distance of d2, the first part of the second connector has a planar portion that lies in said first plane;

the third part of the second connector has a planar portion that lies in said second plane;

the second part of the second connector is arranged to separate the planar portion of the first part of the second connector from the planar portion of the third part of the second connector such that the distance between the planar portion of the first part of the second connector and the planar portion of the third part of the second connector is at least the distance of d2, the minimum distance between the second main surface of the support layer and the first main surface of the circuit board is d2, the minimum distance between the first main surface of the support layer and the first main surface of the circuit board is d2−T, the circuit board has a cavity, and at least a portion of the second part of the first connector is disposed in said cavity.

2. The apparatus of claim 1, in which said first connector is electrically conducting and is physically connected to an electrically conducting surface of the power module.

3. The apparatus of claim 1, in which said second part of the first connector is longer than it is wide.

4. The apparatus of claim 1, in which said third part of the first connector is arranged at an angle which is in the interval 45°-135° with respect to said second part of the first connector.

5. The apparatus of claim 1, in which said attachment surface is a solder surface.

6. The apparatus of claim 1, wherein
at least a portion of the first component is disposed in said cavity,
a top surface of the first component is a second distance in a perpendicular direction from the first main surface of the circuit board, and
said second distance is less than the first distance.

7. The apparatus of claim 1, in which said first connector is attached to a bearer which is attached to the power module.

8. The apparatus of claim 7, in which said bearer comprises one or more first guidance means for guiding the bearer into a predefined position on the power module, with the power module comprising corresponding second guidance means for receiving the first guidance means.

* * * * *